(12) United States Patent
Deng et al.

(10) Patent No.: US 12,132,032 B2
(45) Date of Patent: Oct. 29, 2024

(54) MICRO COMPONENT STRUCTURE AND MANUFACTURING METHOD THEREOF, AND TRANSFER METHOD FOR LIGHT-EMITTING DIODE CHIP

(71) Applicant: CHONGQING KONKA PHOTOELECTRIC TECHNOLOGY RESEARCH INSTITUTE CO., LTD., Chongqing (CN)

(72) Inventors: Xia Deng, Chongqing (CN); Chun-Lung Hsiao, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 377 days.

(21) Appl. No.: 17/720,674

(22) Filed: Apr. 14, 2022

(65) Prior Publication Data
US 2023/0051769 A1 Feb. 16, 2023

Related U.S. Application Data

(63) Continuation of application No. PCT/CN2021/112585, filed on Aug. 13, 2021.

(51) Int. Cl.
*H01L 33/00* (2010.01)
*H01L 25/075* (2006.01)
*H01L 27/15* (2006.01)

(52) U.S. Cl.
CPC ...... *H01L 25/0753* (2013.01); *H01L 33/0093* (2020.05)

(58) Field of Classification Search
CPC ............ H01L 25/0753; H01L 33/0093; H01L 33/0066; H01L 33/0095; H01L 33/62
(Continued)

(56) References Cited

U.S. PATENT DOCUMENTS

2008/0218369 A1* 9/2008 Krans ................. A47G 11/003
313/511
2019/0147778 A1* 5/2019 Xia ..................... H01L 21/6835
257/88

FOREIGN PATENT DOCUMENTS

| CN | 110546751 A | 12/2019 |
|---|---|---|
| CN | 110828364 A | 2/2020 |

(Continued)

OTHER PUBLICATIONS

International Search Report issued in corresponding International Application No. PCT/CN2021/112585, dated Jan. 13, 2022.

*Primary Examiner* — Theresa T Doan
(74) *Attorney, Agent, or Firm* — HAUPTMAN HAM, LLP

(57) ABSTRACT

The disclosure relates to a micro component structure and a manufacturing method thereof, and a transfer method for a light-emitting diode (LED) chip. The micro component structure includes a substrate (300), multiple stacked adhesive layer structures spaced on a first surface (300a) of the substrate (300), and multiple LED chips (20) correspondingly disposed on the multiple stacked adhesive layer structures. Each of the multiple LED chips (20) has two extraction electrodes (21) at a surface facing toward the multiple stacked adhesive layer structures. Each of the multiple stacked adhesive layer structures includes a photolysis adhesive layer (31') and a pyrolysis adhesive layer (32') that are stacked. The photolysis adhesive layer (31') is in contact with the first surface (300a). The pyrolysis adhesive layer (32') is located between the two extraction electrodes (21) and has a thickness greater than a height of each of the two extraction electrodes (21).

8 Claims, 7 Drawing Sheets

(58) Field of Classification Search
USPC .......................................................... 257/79
See application file for complete search history.

(56) References Cited

FOREIGN PATENT DOCUMENTS

| | | |
|---|---|---|
| CN | 111489991 A | 8/2020 |
| CN | 112289908 A | 1/2021 |
| CN | 112582520 A | 3/2021 |
| CN | 112968108 A | 6/2021 |

* cited by examiner

MICRO COMPONENT STRUCTURE AND MANUFACTURING METHOD THEREOF, AND TRANSFER METHOD FOR LIGHT-EMITTING DIODE CHIP

CROSS-REFERENCE TO RELATED APPLICATION(S)

This application is a continuation of International Application No. PCT/CN2021/112585, filed Aug. 13, 2021, the entire disclosure of which is hereby incorporated by reference.

TECHNICAL FIELD

The disclosure relates to the field of displaying, and in particular, to a micro component structure and a manufacturing method thereof, and a transfer method for a light-emitting diode (LED) chip.

BACKGROUND

At present, micro light-emitting diode (LED) display planes, as a new generation of display technology, have various advantages such as higher brightness, better light-emitting efficiency, lower power consumption, and the like, such that the micro LED display planes are widely applied.

In a process of manufacturing the micro LED display plane, three-color LED chips each need to be transferred from its growth substrate onto a display backplane through a mass transfer technology. Presently, seal transfer is one of mainstream mass transfer technologies and generally includes: 1) adhering multiple LED chips on the growth substrate to a temporary substrate provided with an adhesive layer, and then peeling off the growth substrate, thereby achieving transferring of the chips onto the temporary substrate; 2) pressing the LED chips with a transfer substrate, and peeling off the temporary substrate by a laser acting on the adhesive layer on the temporary substrate, thereby achieving transferring of the chips onto the transfer substrate; 3) transferring the LED chips on the transfer substrate onto the display backplane. However, in the transfer process at step 2), the laser usually also acts on the chips (especially on two electrodes of each of the chips), which may cause a certain damage to the chips and reduce a transfer yield of the chips.

SUMMARY

A micro component structure is provided in a first aspect of the disclosure. The micro component structure includes a substrate, multiple stacked adhesive layer structures spaced on a first surface of the substrate, and multiple LED chips correspondingly disposed on the multiple stacked adhesive layer structures. Each of the multiple LED chips has two extraction electrodes at a surface facing toward the multiple stacked adhesive layer structures. Each of the multiple stacked adhesive layer structures includes a photolysis adhesive layer and a pyrolysis adhesive layer that are stacked. The photolysis adhesive layer is in contact with the first surface. The pyrolysis adhesive layer is located between the two extraction electrodes and has a thickness greater than a height of each of the two extraction electrodes.

A manufacturing method for a micro component structure is provided in a second aspect of the disclosure. The manufacturing method includes the following. A photolysis adhesive material and a pyrolysis adhesive material that are stacked are manufactured sequentially on a first surface of a substrate. The substrate is thermal bonded with a growth substrate grown with multiple LED chips, to embed the multiple LED chips into the pyrolysis adhesive material, where each of the multiple LED chips has two extraction electrodes facing toward the photolysis adhesive material. The growth substrate is peeled off. A pyrolysis adhesive material between two adjacent LED chips of the multiple LED chips is removed, and a remaining pyrolysis adhesive material and the photolysis adhesive material are etched, to form a stacked adhesive layer structure between the substrate and each of the multiple LED chips, where the stacked adhesive layer structure includes a photolysis adhesive layer and a pyrolysis adhesive layer, the photolysis adhesive layer is spaced on the first surface, and the pyrolysis adhesive layer is located between the two extraction electrodes of each of the multiple LED chips and has a thickness greater than a height of each of the two extraction electrodes.

A transfer method for an LED chip is provided in a third aspect of the disclosure. The transfer method includes the following. The micro component structure of the first aspect of the disclosure is provided, a transfer substrate is attached to a side of the micro component structure provided with the LED chip, and laser irradiation is performed on the photolysis adhesive layer, to transfer the LED chip and the pyrolysis adhesive layer to the transfer substrate. The LED chip on the transfer substrate is transferred to a display backplane.

Figure 1:
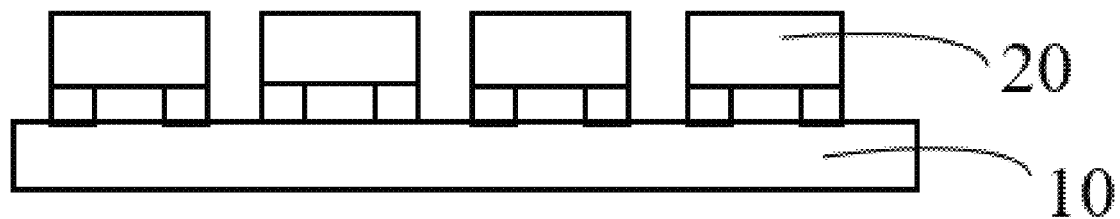
FIGS. 1 to 6 illustrate a general process of mass transfer of light-emitting diode (LED) chips to a display backplane.

Description of reference numbers: 10—growth substrate; 20—LED chip; 21—extraction electrode; 30—temporary substrate; 40—transfer substrate; 50—display backplane; 51—pad group; 300—substrate; 300a—first surface; 31—photolysis adhesive material; 32—pyrolysis adhesive material; 31'—photolysis adhesive layer; 32'—pyrolysis adhesive layer.

DETAILED DESCRIPTION

In order to facilitate understanding of the present disclosure, a detailed description will now be given with reference to relevant accompanying drawings. The accompanying drawings illustrate some examples of implementations of the present disclosure. However, the present disclosure can be implemented in many different forms and is not limited to the implementations described herein. On the contrary, these implementations are provided for a more thorough and comprehensive understanding of the present disclosure.

Unless otherwise defined, all technical and scientific terms used herein have the same meaning as commonly understood by those skilled in the art of the present disclosure. The terms used herein in the disclosure are for the purpose of describing implementations only and are not intended to limit the disclosure.

A micro component structure is provided in a first aspect of the disclosure. The micro component structure includes a substrate, multiple stacked adhesive layer structures spaced on a first surface of the substrate, and multiple LED chips correspondingly disposed on the multiple stacked adhesive layer structures. Each of the multiple LED chips has two extraction electrodes at a surface facing toward the multiple stacked adhesive layer structures. Each of the multiple stacked adhesive layer structures includes a photolysis adhesive layer and a pyrolysis adhesive layer that are stacked. The photolysis adhesive layer is in contact with the first surface. The pyrolysis adhesive layer is located between the two extraction electrodes and has a thickness greater than a height of each of the two extraction electrodes.

In the disclosure, by disposing the stacked adhesive layer structure, spaced on the substrate, between the substrate and the LED chip of the micro component structure, when the LED chip of the micro component structure needs to be transferred to a transfer substrate, laser energy needed for dissociating the photolysis adhesive layer in the stacked adhesive layer structure connected with the LED chip is lower, so that the LED chip is less damaged. Since the pyrolysis adhesive layer inserted between the two extraction electrodes of the chip is disposed between the LED chip and the photolysis adhesive layer and has the thickness greater than the height of each of the extraction electrodes of the chip, when the photolysis adhesive layers is dissociated by a laser, the pyrolysis adhesive layer can prevent the laser from irradiating the LED chip to some extent, further reducing the damage of the laser to the LED chip, thereby significantly improving a transfer yield of the chip.

Optionally, the pyrolysis adhesive layer has a hot melt temperature lower than the photolysis adhesive layer, and a difference between hot melt temperatures of the pyrolysis adhesive layer and the photolysis adhesive layer is greater than 20° C. In this case, during manufacturing of the micro component structure, when the pyrolysis adhesive layer is embedded between the two electrodes of the LED chip by melting a material of the pyrolysis adhesive layer, the photolysis adhesive material corresponding to the photolysis adhesive layer can well keep a structural shape of the photolysis adhesive layer unchanged.

Optionally, the thickness of the pyrolysis adhesive layer is greater than a thickness of the photolysis adhesive layer. In this case, the photolysis adhesive layer can be subsequently peptized by a laser with lower energy, and during peptization of the photolysis adhesive layer, the pyrolysis adhesive layer can prevent an irradiation damage of the laser to the LED chip.

Optionally, a width of the photolysis adhesive layer is greater than or equal to a width of the pyrolysis adhesive layer. Such photolysis adhesive layer is easier to be manufactured and can better support the pyrolysis adhesive layer and the LED chip.

A manufacturing method for a micro component structure is provided in a second aspect of the disclosure. The manufacturing method includes the following. A photolysis adhesive material and a pyrolysis adhesive material that are stacked are manufactured sequentially on a first surface of a substrate. The substrate is thermal bonded with a growth substrate grown with multiple LED chips, to embed the multiple LED chips into the pyrolysis adhesive material, where each of the multiple LED chips has two extraction electrodes facing toward the photolysis adhesive material. The growth substrate is peeled off. A pyrolysis adhesive material between two adjacent LED chips of the multiple LED chips is removed, and a remaining pyrolysis adhesive material and the photolysis adhesive material are etched, to form a stacked adhesive layer structure between the substrate and each of the multiple LED chips, where the stacked adhesive layer structure includes a photolysis adhesive layer and a pyrolysis adhesive layer, the photolysis adhesive layer is spaced on the first surface, and the pyrolysis adhesive layer is located between the two extraction electrodes of each of the multiple LED chips and has a thickness greater than a height of each of the two extraction electrodes.

The manufacturing method for a micro component structure mentioned above has simple processes, convenient operations, and high controllability, and the stacked adhesive layer structure formed on the obtained micro component structure can well reduce a damage of the laser to the LED chips on the stacked adhesive layer structure during transferring. In addition, the multiple stacked adhesive layer structures formed through two-step etching have a high uniformity in size, facilitating subsequent batch peptization of the photolysis adhesive layers in the multiple stacked adhesive layer structures, thus avoiding a problem that some chips are easy to be damaged due to inconsistent peptization time.

Optionally, the pyrolysis adhesive material between the two adjacent LED chips can be removed in various manners which include wet etching or dry etching. In the wet etching, at least one of acetone or N-methyl pyrrolidone (NMP) is used as an etching liquid. In the dry etching, an etching gas used includes oxygen ($O_2$). Therefore, with the LED chips as a mask, the wet etching or the dry etching each can perform perpendicular etching on the pyrolysis adhesive material in a direction away from the surface of the photolysis adhesive material.

Optionally, the remaining pyrolysis adhesive material and the photolysis adhesive material are etched by the dry etching, and the dry etching includes etching with $O_2$ for 10 to 20 minutes and then etching with a fluorine-containing gas for 5 to 8 minutes. The specific dry etching process used in the operations at this step is more controllable, such that a finer stacked adhesive layer structure is easier to be formed, and the obtained stacked adhesive layer structures have a high uniformity in size, so that the LED chips are not easy to be damaged.

A transfer method for an LED chip is provided in a third aspect of the disclosure. The transfer method includes the following. The micro component structure of the first aspect of the disclosure is provided, a transfer substrate is attached to a side of the micro component structure provided with the LED chip, and laser irradiation is performed on the photolysis adhesive layer, to transfer the LED chip and the pyrolysis adhesive layer to the transfer substrate. The LED chip on the transfer substrate is transferred to a display backplane.

In the transfer method for an LED chip mentioned above, when the LED chip is transferred from the micro component structure with special stacked adhesive layer structures to the transfer substrate, the photolysis adhesive layer connected with the chip can be dissociated with lower laser energy, and laser irradiation on the LED chip can be better prevented, thereby greatly reducing a damage of the laser to the chip during transferring of the chip and improving a transfer yield of the chip. In addition, when the LED chip on the transfer substrate is transferred to the display backplane, the pyrolysis adhesive layer connected with the chip can further improve a bonding force between the LED chip and the display backplane after hot melting and cooling.

Optionally, the LED chip on the transfer substrate is transferred to the display panel as follows. A side of the transfer substrate provided with the LED chip is faced toward a side of the display backplane provided with multiple pad groups, and the two extraction electrodes are electrically connected with each of the multiple pad groups correspondingly through thermal bonding, where after cooling, the pyrolysis adhesive layer is filled between the two extraction electrodes and each of the multiple pad groups. The transfer substrate is peeled off. Therefore, the bonding force between the LED chip and the display backplane can be improved.

A display apparatus is provided in a fourth aspect of the disclosure. The display apparatus includes a display backplane and multiple LED chips, where the multiple LED chips are transferred onto the display backplane through the transfer method described in the third aspect of the disclosure.

Generally, a red light-emitting diode (LED) chip, a blue LED chip, and a green LED chip are respectively transferred when LED chips 20 are transferred onto a display backplane 100. The following will take one LED chip 20 as an example for illustration, and the other two LED chips are based on the same principle, which will not be repeated herein.

FIGS. 1 to 6 illustrate a general process of mass transfer of LED chips to a display backplane. Specifically, the process includes operations at S11, operations at S12, and operations at S13.

Figure 2:

At S11, as illustrated in FIG. 1, a growth substrate 10 (wafer) is provided, where an LED chip 20 is grown on the growth substrate 10. A side of the growth substrate 10 provided with the LED chip 20 is attached to a side of a temporary substrate 30 provided with an adhesive layer (generally, photolysis), so that the LED chip 20 is adhered onto the temporary substrate 30 (as illustrated in FIG. 2). Then the growth substrate 10 on the LED chip 20 is peeled off. As such, the LED chip 20 is transferred onto the temporary substrate 30, as illustrated in FIG. 3.

Figure 4:
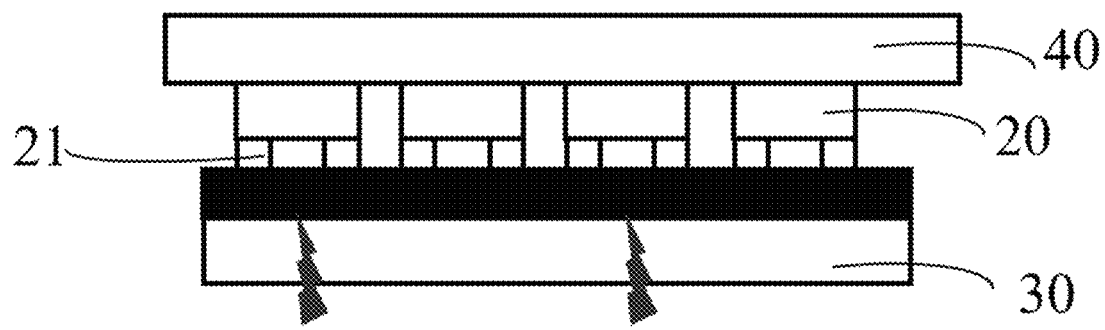
Figure 5:
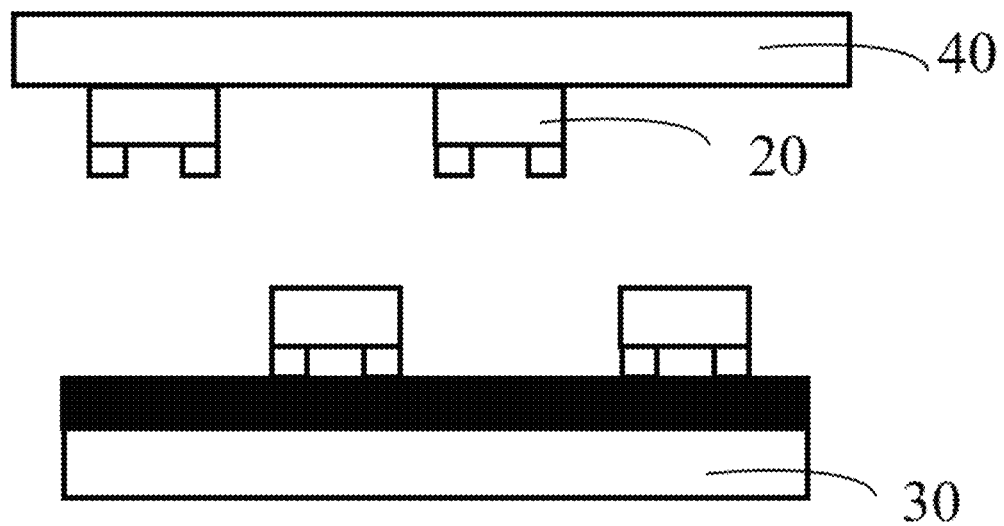

At S12, the LED chip on the temporary substrate 30 is pressed with a transfer substrate 40, and a laser is focused on a photolysis adhesive position where the LED chip 20 to be picked is connected (as illustrated in FIG. 4), so as to dissociate a photolysis under a corresponding LED chip, thereby selectively transferring the LED chip 20 onto the transfer substrate 40. FIG. 5 illustrates that the transfer substrate 40 selectively picks the LED chip 20 on the temporary substrate 30.

Figure 6:
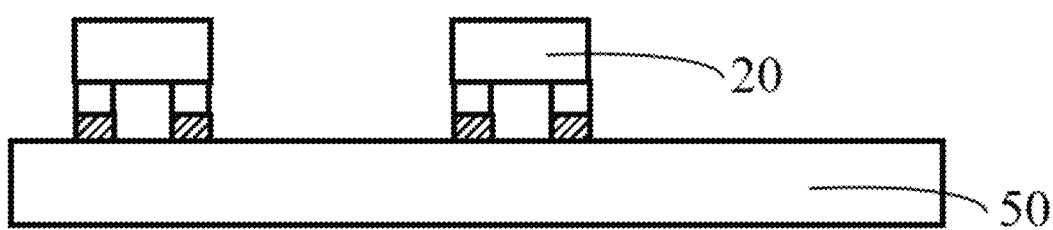

At S13, the LED chip 20 on the transfer substrate 40 is transferred onto a display backplane 50. Referring to FIG. 6, FIG. 6 is a schematic diagram illustrating successful transferring of the LED chip 20 onto the display backplane 50.

Figure 3:
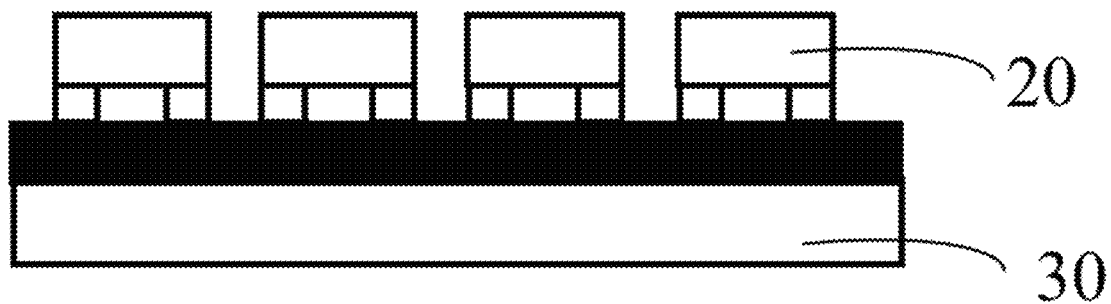

As can be known from FIG. 3, the photolysis adhesive layer on the temporary substrate 30 generally covers an entire surface of the temporary substrate 30. When the laser irradiates the photolysis adhesive layer to pick the LED chip 20 as illustrated in FIG. 4, dissociation of the photolysis adhesive layer corresponding to the LED chip 20 generally needs higher laser energy, and the laser may inevitably irradiate an extraction electrode 21 of the LED chip 20, which may damage the LED chip 20 and result in electrical abnormality, thereby decreasing a transfer yield of the LED chip 20.

Based on the above, a solution is provided in the disclosure, to solve the above-mentioned technical problems. The solution will be explained in details in the following implementations.

Referring to FIGS. 7 to 13, FIG. 13 is a schematic structural diagram illustrating a micro component structure used in a transfer method for an LED chip provided in an implementation of the disclosure. FIGS. 7 to 13 are flow charts illustrating a manufacturing process of a micro component structure provided in an implementation of the disclosure. The manufacturing method for a micro component structure includes operations at S110 to S150.

Figure 7:
FIGS. 7 to 13 are flow charts illustrating a manufacturing process of a micro component structure provided in an implementation of the disclosure.

At S110, a substrate 300 is provided, and as illustrated in FIG. 7, a photolysis adhesive material 31 and a pyrolysis adhesive material 32 that are stacked are manufactured sequentially on a first surface 300a of the substrate 300.

The substrate 300 has two opposite surfaces, and the first surface 300a refers to a surface on which the photolysis adhesive material 31 and the pyrolysis adhesive material 32 are to be disposed. As illustrated in FIG. 7, the photolysis adhesive material 31 is continuously distributed on the first surface 300a of the substrate 300 and can completely cover the first surface 300a of the substrate 300. Correspondingly, the pyrolysis adhesive material 32 also can be continuously distributed on the photolysis adhesive material 31 and completely cover a surface of the photolysis adhesive material 31 away from the substrate 300. The photolysis adhesive material 31 can be peptized due to adhesiveness reduction under irradiation of a laser with a preset wavelength, and after cooling, the pyrolysis adhesive material can recover adhesiveness. The pyrolysis adhesive material 32 can be peptized due to adhesiveness reduction when heated to a preset temperature. The pyrolysis adhesive material 32 does not react with the laser.

Figure 13:
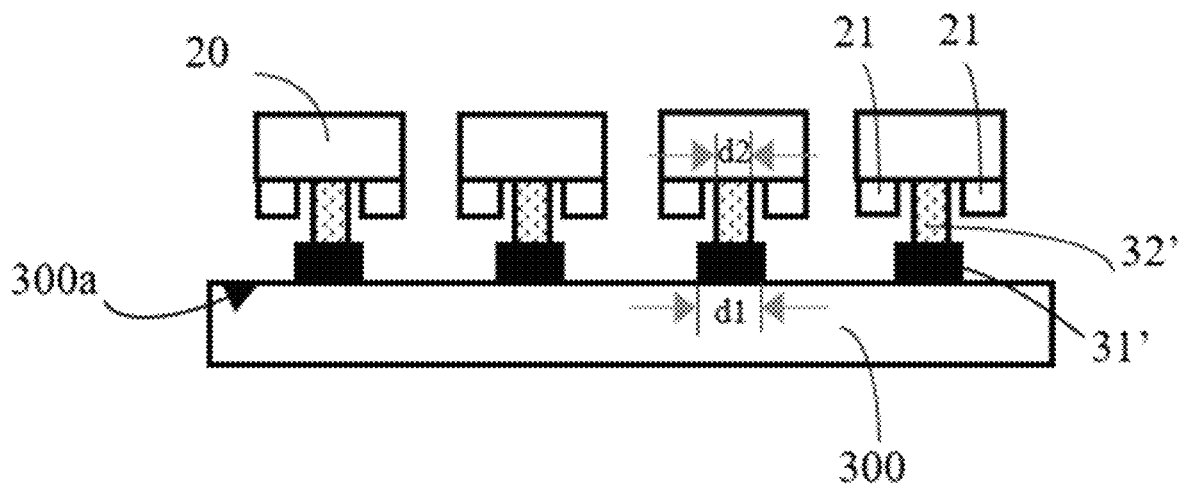

The photolysis adhesive material 31 and the pyrolysis adhesive material 32 can be manufactured through a coating method, and specifically, any one of spin coating, brush coating, spray coating, or the like can be independently used. After coating the photolysis adhesive material 31, the photolysis adhesive material 31 needs to be cured before the pyrolysis adhesive material 32 is coated on the photolysis adhesive material 31 and then cured. Optionally, the photolysis adhesive material 31 has a thickness between 2 μm and 3 μm. The photolysis adhesive material 31 with an appropriate thickness can not only support the LED chip well (as illustrated in FIG. 13), but also facilitate subsequent peptization through a laser with lower energy.

In implementations of the disclosure, the pyrolysis adhesive material 32 has a hot melt temperature lower than the photolysis adhesive material 31. In this case, when connection between the substrate 300 and the growth substrate grown with the LED chip is subsequently achieved through the pyrolysis adhesive material 32, the photolysis adhesive material 31 still can keep the shape unchanged. In some implementations, a difference between hot melt temperatures of the pyrolysis adhesive material 32 and the photolysis adhesive material 31 can be greater than or equal to 20° C. In this case, the difference between hot melt temperatures of the two adhesive materials is more appropriate so that the photolysis adhesive material 31 can keep its structural shape well when the pyrolysis adhesive material 32 is melted.

Figure 8:
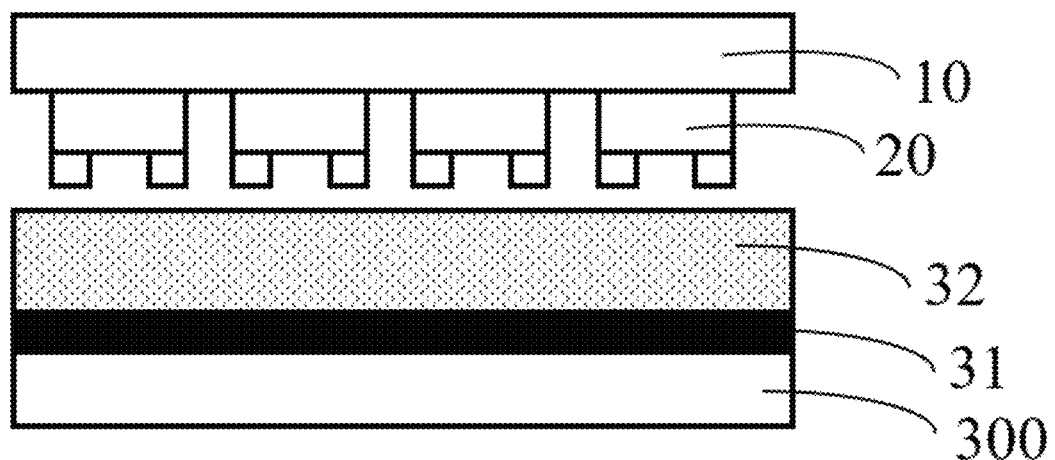
Figure 9:
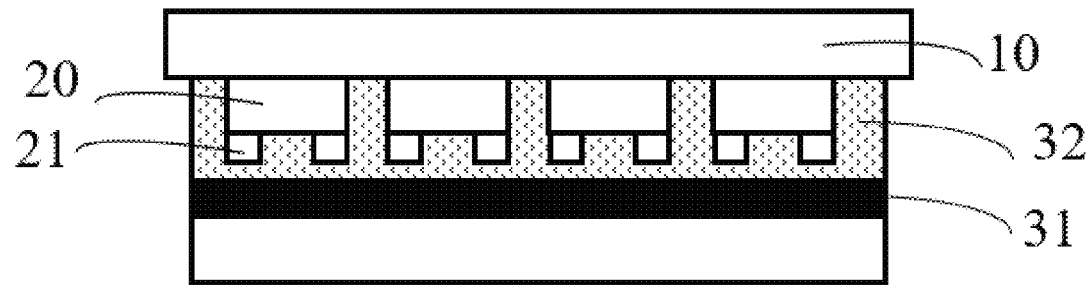
Figure 10:
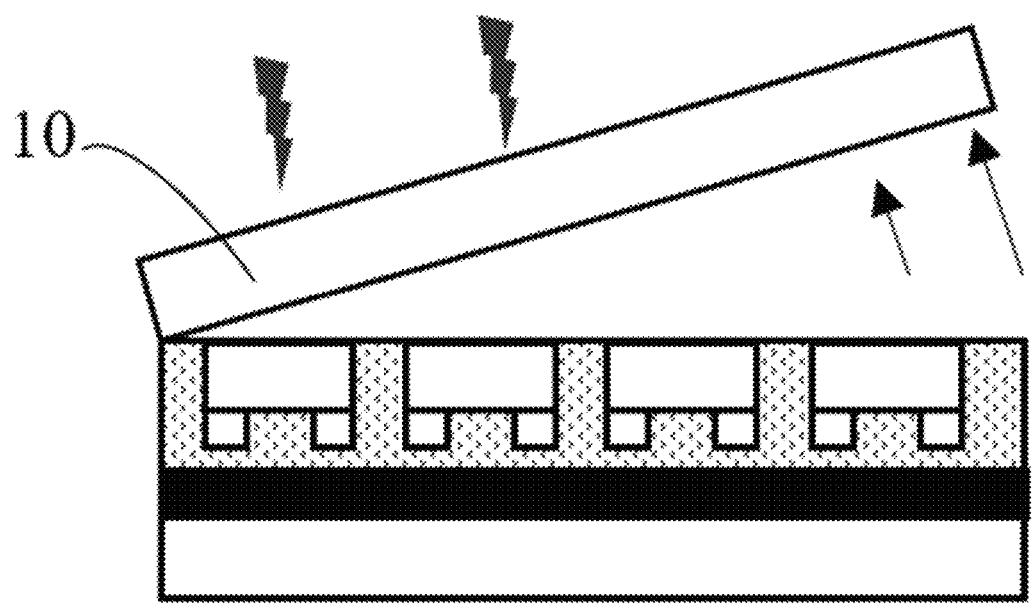
Figure 11:
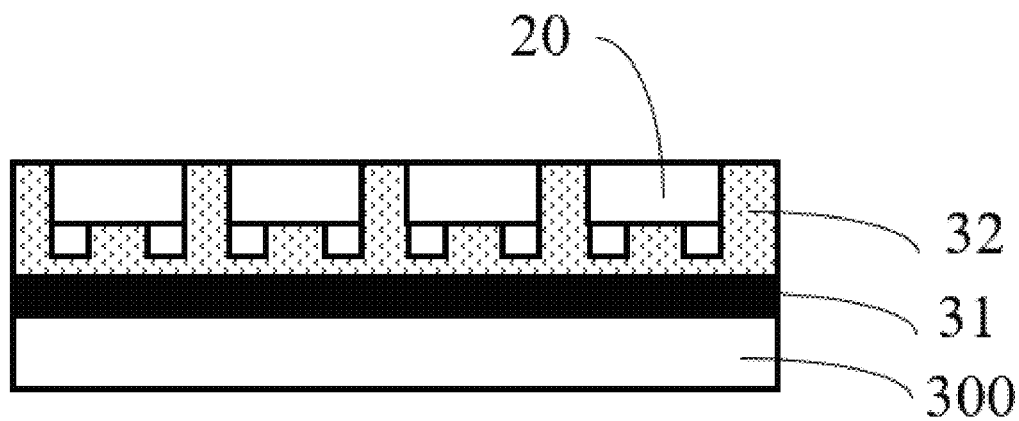

At S120, as illustrated in FIG. 8, the substrate 300 is thermal bonded with the growth substrate 10 grown with the multiple LED chips 20, to embed the multiple LED chips 20 into the pyrolysis adhesive material 32, where each of the multiple LED chips 20 has two extraction electrodes 21 facing toward the photolysis adhesive material 31 (as illustrated in FIG. 9). The growth substrate 10 is peeled off (as illustrated in FIG. 10), such that a structure as illustrated in FIG. 11 can be obtained.

In the operations at S120, during thermal bonding, the side of the growth substrate 10 with the LED chip 20 can be attached to the side of the substrate 300 with the pyrolysis adhesive material 32 by a bonding device, and the LED chip 20 can be embedded into the pyrolysis adhesive material 32 under heating and pressing. A temperature of the thermal bonding may be greater than or equal to the hot melt temperature of the pyrolysis adhesive material 32, such that the pyrolysis adhesive material 32 can be heated and melted, to achieve connection between the growth substrate 10 and the photolysis adhesive material 31. Of course, the temperature of the thermal bonding may be lower than the hot melt temperature of the photolysis adhesive material 31, to avoid deformation of the photolysis adhesive material 31 due to melting during the thermal bonding.

For embedding the LED chip 20 into the pyrolysis adhesive material 32, the thickness of the pyrolysis adhesive material 32 may be greater than or equal to a height of the LED chip 20. In some implementations, a surface of the pyrolysis adhesive material 32 away from the photolysis adhesive material 31 can be flush with a surface of the LED chip 20 away from the photolysis adhesive material 31.

Generally, the multiple LED chips 20 are arranged in array on the growth substrate 10, and any two adjacent LED chips 20 are spaced by a distance. Generally, each LED chip 20 has two electrodes 21, where the two electrodes 21 generally are a positive electrode and a negative electrode, to facilitate subsequent corresponding connection with the positive and negative pads on the display backplane. Generally, the growth substrate 10 is made of a gallium-containing sapphire. The growth substrate 10 can be peeled off through laser lift off (LLO) technology. Optionally, after peeling, dilute hydrochloric acid is used to clean remaining metal gallium on the LED chip 20.

Figure 12:
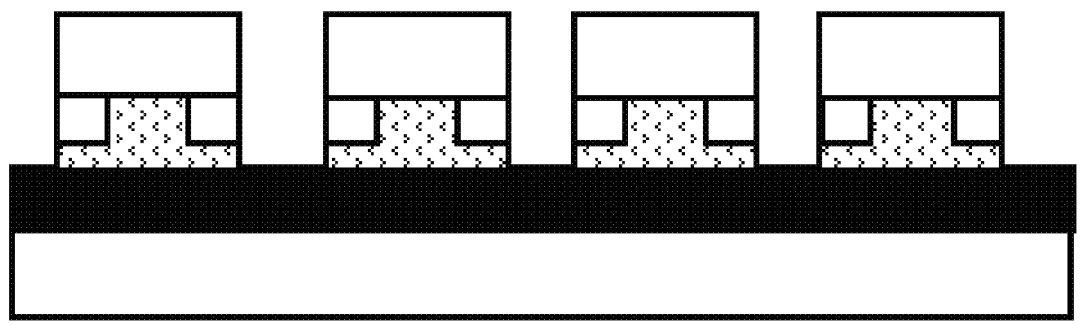

At S130, a structure as illustrated in FIG. 12 is obtained by removing a pyrolysis adhesive material 32 between two adjacent LED chips 20, and a remaining pyrolysis adhesive material 32 and the photolysis adhesive material 31 are etched, to form a stacked adhesive layer structure between the substrate 300 and each LED chip 20, such that a micro component structure as illustrated in FIG. 13 can be obtained. The stacked adhesive layer structure includes a photolysis adhesive layer 31' and a pyrolysis adhesive layer 32', where the photolysis adhesive layer 31' is spaced on the first surface of the substrate 300, and the pyrolysis adhesive layer 32' is located between the two extraction electrodes 21 of the LED chip 20 and has a thickness greater than a height of each of the two extraction electrodes 21.

In the operations at S130, the pyrolysis adhesive material 32 between the two adjacent LED chips 20 can be removed in various manners which may include wet etching or dry etching. In the wet etching, at least one of acetone, N-methyl pyrrolidone (NMP), or a combination of acetone and NMP can be used as an etching liquid. Specifically, the etching liquid can be coated on the surface of the pyrolysis adhesive material 32 away from the photolysis adhesive material 31 as illustrated in FIG. 11, and in this case, an inverted LED chip 20 can be used as a mask for the wet etching, such that selective etching of the pyrolysis adhesive material 32 between two adjacent LED chips 20 can be realized without introducing an additional mask. That is, etching is performed in a direction perpendicular to the surface of the pyrolysis adhesive material 32 away from the photolysis adhesive material 31 (simply called perpendicular etching), and in other words, etching is performed in a thickness direction of the pyrolysis adhesive material 32. Optionally, after the wet etching, the structure as illustrated in FIG. 12 should be washed with ethanol, water, etc., so as to avoid a remaining etching liquid affecting next etching.

The dry etching can use an etching gas to perform the perpendicular etching on the pyrolysis adhesive material 32 between the two adjacent LED chips 20. The inverted LED chip 20 still can be used as a mask for the dry etching without introducing an additional mask. The etching gas can be introduced directly towards the surface of the pyrolysis adhesive material 32 away from the photolysis adhesive material 31 as illustrated in FIG. 11. The etching gas may be oxygen ($O_2$).

In the operations at S130, the remaining pyrolysis adhesive material 32 and the photolysis adhesive material 31 are etched by the dry etching. Compared to the wet etching, the dry etching is more controllable. With the dry etching, a finer micro structure is easier to be formed, the LED chip is not easy to be damaged, and the obtained stacked adhesive layers structures have a high uniformity in size. In some implementations, the dry etching includes etching with $O_2$ for 10 to 20 minutes and then etching with a fluorine-containing gas for 5 to 8 minutes. The fluorine-containing gas may be at least one of tetrafluoromethane ($CF_4$), sulfur hexafluoride ($SF_6$), or the like. For example, the fluorine-containing gas may be one of $CF_4$, $SF_6$, or a combination of $CF_4$ and $SF_6$. Generally, since the fluorine-containing gas has an etching rate higher than $O_2$, an etching duration with the fluorine-containing gas is shorter than that with $O_2$, which ensures that a product with a higher matching degree with a required micro structure can be obtained. Optionally, an inlet flow rate of $O_2$ to the fluorine-containing gas may be (5-40):1, such as 10:1, 15:1, 20:1, 25:1, 30:1, 40:1, or the like. In addition, it can be understood that, during etching at S130, a temperate of a chamber at which the substrate is located is lower than the hot melt temperature of the pyrolysis adhesive material 32, such that the pyrolysis adhesive material 32 and the photolysis adhesive material 31 may not be melted during etching and the required micro structure can be obtained after etching.

As illustrated in FIG. 13, the micro component structure includes the substrate 300, multiple stacked adhesive layer structures, and the multiple LED chips 20, where the multiple stacked adhesive layer structures are spaced on the first surface 300a of the substrate 300, the LED chips 20 are located on the multiple stacked adhesive layer structures, the multiple LED chips 20 are in one-to-one correspondence with the multiple stacked adhesive layer structures, and each of the multiple LED chips 20 has two extraction electrodes 21 at the surface facing toward the multiple stacked adhesive layer structures. Each of the multiple stacked adhesive layer structure includes the photolysis adhesive layer 31' and the pyrolysis adhesive layer 32' that are stacked, the photolysis adhesive layer 31' is in contact with the first surface 300a, and the pyrolysis adhesive layer 32' is located between the two extraction electrodes 21 of each LED chip 20 and has the thickness greater than the height of each of the two extraction electrodes 21. The term "one-to-one correspondence" herein means that each stacked adhesive layer structure is connected with one LED chip 20, and the number of the multiple stacked adhesive layer structures is the same as that of the multiple LED chips 20.

As can be seen in FIG. 13, the photolysis adhesive layers 31' are not continuously distributed on the first surface 300a but distributed at intervals, and the number of the photolysis adhesive layers 31' is the same as that of the LED chips 20. Compared with the substrate covered with the photolysis adhesive layer on the whole surface, in the disclosure, the photolysis adhesive layers 31' has a low total coverage rate on the substrate 300. When the LED chips 20 of the micro component structure as illustrated in FIG. 13 need to be transferred to a transfer substrate (referring to FIG. 14), laser energy needed for dissociating the photolysis adhesive layer 31' in the stacked adhesive layer structure connected with the LED chips 20 is lower, and the LED chips 20 are less damaged correspondingly. In addition, since the pyrolysis adhesive layer 32' inserted between the two extraction electrodes 21 of the chip is disposed between the LED chip 20 and the photolysis adhesive layer 31' and has the thickness greater than the height of each of the two extraction electrodes 21 of the chip, when the photolysis adhesive layers 31' is dissociated by a laser, the pyrolysis adhesive layer 32' can prevent the laser from irradiating the LED chip 20, further reducing the damage of the laser to the LED chip 20, thereby significantly improving a transfer yield of the chip.

In implementations of the disclosure, the thickness of the pyrolysis adhesive layer 32' is greater than a thickness of the photolysis adhesive layer 31'. In this case, the photolysis adhesive layer 31' can be subsequently peptized by a laser with lower energy, and during peptization of the photolysis adhesive layer 31', the pyrolysis adhesive layer 32' can prevent the laser from irradiating the LED chip 20. In some implementations, the thickness of the photolysis adhesive layer 31' is between 2 μm and 3 μm, such as 2.2 μm, 2.5 μm, 2.8 μm, or the like. In this case, the photolysis adhesive layer 31' can support well the pyrolysis adhesive layer 32' and the LED chip 20 and facilitate subsequent peptization. In some implementations, the thickness of the pyrolysis adhesive layer 32' is between 4 μm and 6 μm, such as 4.5 μm, 5 μm, 5.5 μm, or the like.

It can be understood that, since the pyrolysis adhesive layer 32' is located between the two extraction electrodes 21 of the LED chip 20, width d2 of the pyrolysis adhesive layer 32' may be less than or equal to a gap between the two extraction electrodes 21 of the LED chip 20. In some implementations, width d2 of the pyrolysis adhesive layer 32' may be between 2 μm and 6 μm, such as 2.5 μm, 3 μm, 4 μm, 5 μm, or the like. In some implementations of the disclosure, width d1 of the photolysis adhesive layer 31' is greater than or equal to width d2 of the pyrolysis adhesive layer 32' (in FIG. 13, d1>d2). In other words, a projection of the photolysis adhesive layer 31' on the substrate 300 covers a projection of the pyrolysis adhesive layer 32' on the substrate 300. As such, it is helpful for the photolysis adhesive layer 31' to better support the pyrolysis adhesive layer 32' and the LED chip 20, and such photolysis adhesive layer 31' can be easily obtained through the above etching process. The width d1 of the photolysis adhesive layer 31' may be between 4 μm and 9 μm. Furthermore, width d1 of the photolysis adhesive layer 31' also may be less than or equal to the gap between the two extraction electrodes 21 of the LED chip 20, so as to reduce laser irradiation on the electrodes of the chip when the photolysis adhesive layer 31' is dissociated by the laser. Optionally, two adjacent photolysis adhesive layers 31' are spaced by a distance between 30 μm and 40 μm. In this case, the photolysis adhesive layer 31' has a low total coverage rate on the substrate 300, facilitating subsequent laser peptization.

Of course, in other implementations of the disclosure, width d1 of the photolysis adhesive layer 31' also may be less than width d2 of the pyrolysis adhesive layer 32'. In this case, when the laser peptization is subsequently performed on the photolysis adhesive layer 31', the pyrolysis adhesive layer 32' with a greater width on the photolysis adhesive layer 31' can well prevent laser irradiation on the LED chip 20, thereby greatly reducing the damage of the laser to the LED chip 20.

The manufacturing method for a micro component structure provided in the disclosure has simple processes, convenient operations, and high controllability, and the stacked adhesive layer structure formed on the obtained micro component structure can well reduce the damage of the laser to the LED chip 20 on the stacked adhesive layer structure during transferring. In addition, the multiple stacked adhesive layer structures formed through two-step etching in the operations at S130 have a high uniformity, i.e., the multiple stacked adhesive layer structures connected with each chip have less size difference, facilitating subsequent batch peptization of the photolysis adhesive layers 31' in the multiple stacked adhesive layer structures with the same laser energy, and peptization time is similar, thus avoiding a problem that some chips are easy to be damaged due to inconsistent peptization time.

A transfer method for an LED chip (also called transfer method for an LED chip) is further provided in implementations of the disclosure. The transfer method includes operations at S140 and S150.

Figure 14:
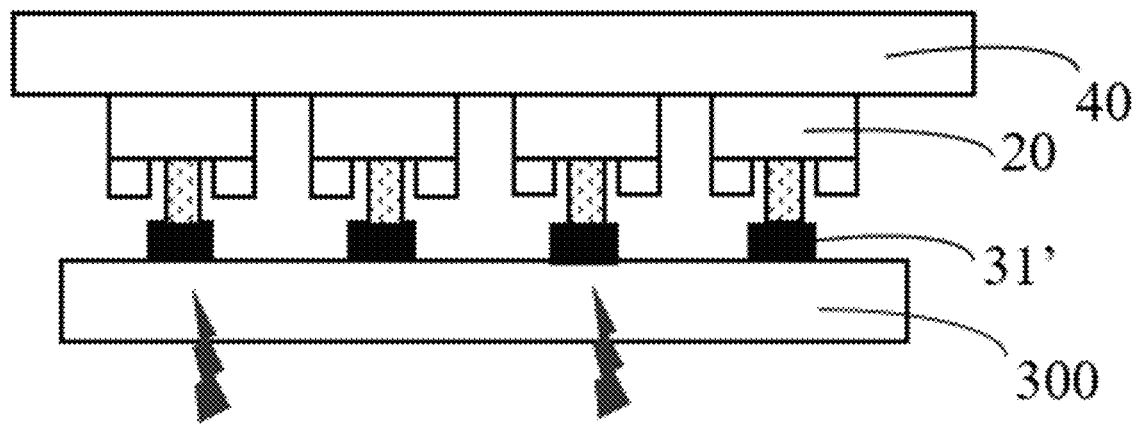
FIGS. 14 to 18 are schematic flow charts illustrating a transfer method for an LED provided in an implementation of the disclosure.
Figure 15:
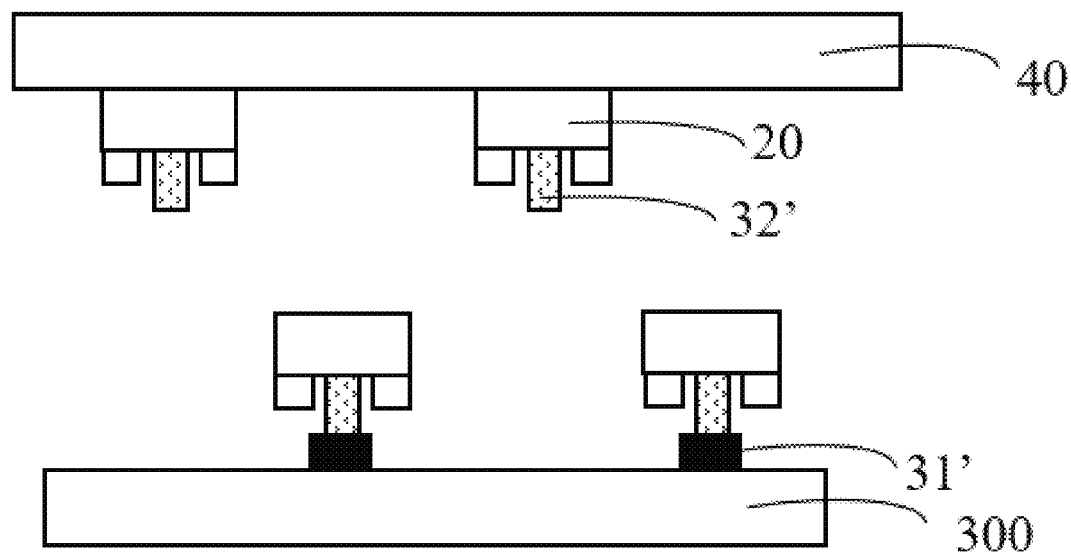

At S140, the micro component structure (as illustrated in FIG. 13) mentioned above in the disclosure and a transfer substrate 40 are provided, referring to FIG. 14, the transfer substrate 40 is attached to a side of the micro component structure provided with the LED chip 20, and laser irradiation is performed on the photolysis adhesive layer 31', to transfer the LED chip 20 and the pyrolysis adhesive layer 32' to the transfer substrate 40 (as illustrated in FIG. 15).

The transferring of the LED chips 20 in the operations at S140 may be that the LED chips 20 of the micro component structure all are transferred onto the transfer substrate 40, or a part of the LED chips 20 are selectively transferred onto the transfer substrate 40 (also may be called selective pickup for the chips). During transferring of the LED chips 20, through positioning, the laser is focused to the photolysis adhesive layer 31' in the stacked adhesive layer structure of the micro component structure connected with the LED chips to be picked (may be all chips or a part of chips), laser irradiation is performed on the photolysis adhesive layer 31', to reduce adhesiveness of the photolysis adhesive layer 31' so as to peptize the photolysis adhesive layer 31', and the LED chips 20 are disconnected from the substrate 300, thereby achieving transferring of the LED chips 20 onto the transfer substrate 40. During peptization for the photolysis adhesive layer 31', since adhesiveness of the pyrolysis adhesive layer 32' is almost unchanged, the pyrolysis adhesive layer 32' connected with the LED chips 20 is also correspondingly transferred onto the transfer substrate 40.

It can be understood that, when the LED chips 20 of the micro component structure are selectively picked, for ensuring that the LED chips 20 not to be picked may not be picked by the transfer substrate 40, there should be a certain adhesive force between the transfer substrate 40 and the LED chips 20, and the adhesive force may be less than an adhesive force between the substrate 300 and the photolysis adhesive layer 31' of the micro component structure. In some implementations of the disclosure, the transfer substrate 40 attached to the micro component structure can have an adhesive layer and can selectively adhere the LED chips 20 onto the transfer substrate 40 with the aid of the adhesive layer. In other implementations of the disclosure, the transfer substrate 40 may be made of one or more of polydimethylsiloxane (PDMS), polyurethane (PUA), ethylene-vinyl acetate copolymer (EVA), polymethylmethacrylate (PMMA), or the like. In this case, the transfer substrate 40 has a certain adhesiveness, so it is unnecessary to dispose an adhesive layer on the transfer substrate 40, and the transfer substrate 40 meets the adhesive force characteristic mentioned above. Generally, the transfer substrate 40 is usually made of PDMS.

At S150, the LED chip 20 on the transfer substrate 40 is transferred to the display backplane 50.

In some implementations, the operations at S150 specifically includes the following.

Figure 16:
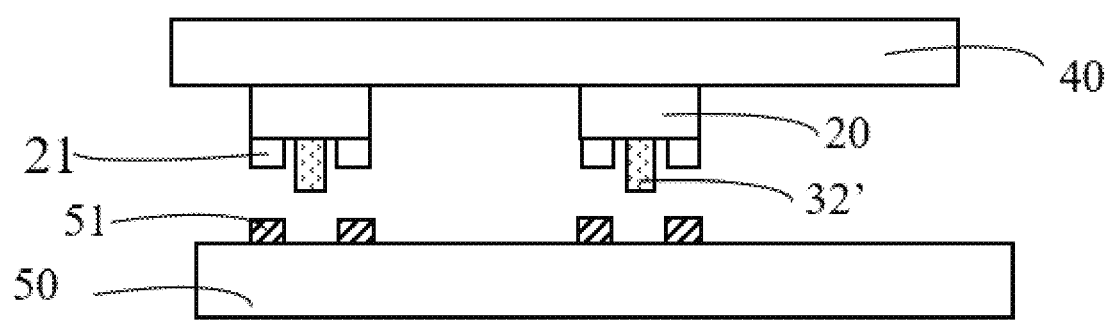
Figure 17:
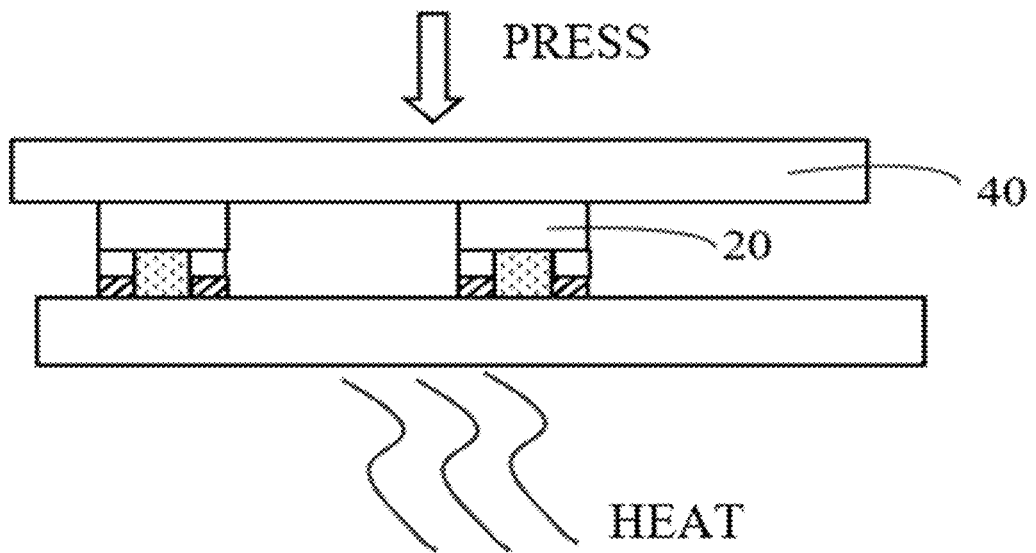

At S151, as illustrated in FIG. 16, a side of the transfer substrate 40 provided with the LED chip 20 is faced toward a side of the display backplane 50 provided with multiple pad groups 51, the two extraction electrodes 21 of the LED chip 20 are electrically connected with each of the multiple pad groups 51 correspondingly through thermal bonding, and after cooling, the pyrolysis adhesive layer 32' is filled between the two extraction electrodes 21 and each of the multiple pad groups 51 as illustrated in FIG. 17.

Figure 18:
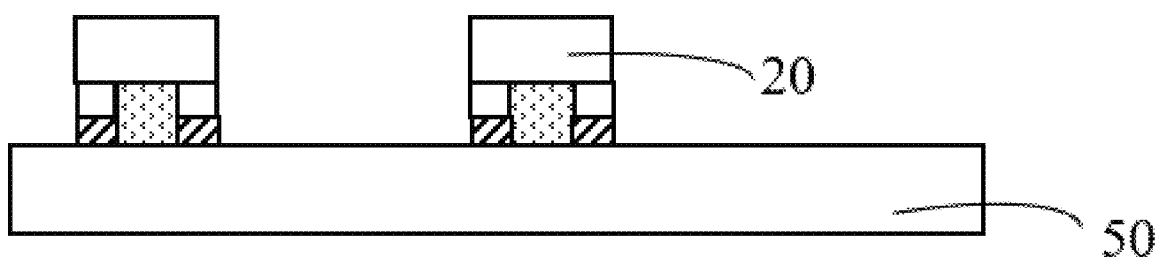

At S152, a product as illustrated in FIG. 18 is obtained by peeling off the transfer substrate 40.

In the operations at S151, when the transfer substrate 40 is faced toward the display backplane 50, the transfer substrate 40 can be suspended above the display backplane 50, such that the multiple LED chips 20 are in one-to-one correspondence with the multiple pad groups 51 on the display backplane 50. The display backplane 50 may be a thin film transistor (TFT) circuit board. The display backplane 50 has two opposite surfaces, where one of the two opposite surfaces has the multiple pad groups 51. Since the pad groups 51 are used for subsequent corresponding electrical connection with the two extraction electrodes 21 (i.e., a positive extraction electrode and a negative extraction electrode) of the LED chip 20, each of the multiple pad groups 51 includes two pads, called positive pad and negative pad. When the transfer substrate 40 is faced toward the display backplane 50, a positive extraction electrode of each LED chip 20 corresponds to a positive pad, and a negative extraction electrode corresponds to a negative pad.

During the thermal bonding at the operations at S151, the transfer substrate 40 and the display backplane 50 can be heated and pressed. After the thermal bonding is completed, the extraction electrodes 21 of the LED chip 20 are in fixed connection with the pad group 51 of the display backplane 50, ensuring a stable electrical connection between the extraction electrodes 21 and the pad group 51. In other words, mass welding of the LED chips 20 is completed.

In some implementations, a surface of the transfer substrate 40 away from the LED chip 20 can be pressed (as illustrated in FIG. 17), to attach the transfer substrate 40 to the display backplane 50. The display backplane 50 is heated, or a structure formed by attaching the transfer substrate 40 to the display backplane 50 is placed in a heating environment. Since the transfer substrate 40 can be made of soft materials such as PDMS or the like and thus has a certain deformability, the transfer substrate 40 can prevent the LED chip 20 from being crushed when the transfer substrate 40 is pressed. Since the thickness of the pyrolysis adhesive layer 32' is greater than the height of the electrode of the chip, the pyrolysis adhesive layer 32' also can be inserted between a pad group of the display backplane 50 and then heated and melted. When cooled down, the pyrolysis adhesive layer 32' can be filled between the extraction electrodes 21 and the pad group 51, thereby further strengthening a bonding force between the LED chip 20 and the display backplane 50, which avoids to additionally coat an adhesive material on the display backplane 50 to strengthen the bonding force between the LED chip 20 and the display backplane 50 in the related art. Similarly, a temperature of the thermal bonding in the operations at S151 may be greater than or equal to the hot melt temperature of the pyrolysis adhesive layer 32'.

Of course, in other implementations of the disclosure, the surface of the transfer substrate 40 away from the LED chip 20 and a surface of the display backplane 50 without the pad group 51 can be simultaneously pressed to combine together, and the combined structure is placed in a heating environment.

In some implementations of the disclosure, in the operations at S152, the transfer substrate 40 can be peeled off in a mechanical manner, which is mainly based on that the bonding force between the LED chip 20 and the display backplane 50 is greater than the adhesive force between the transfer substrate 40 and the LED chip 20. The manner of peeling off the transfer substrate 40 is more simple and convenient. Of course, if the transfer substrate 40 has an adhesive layer as illustrated in the operations at S140, the transfer substrate 40 can be peeled off by peptizing the adhesive layer between the transfer substrate 40 and the LED chip 20.

As can be known from the above illustration, in the transfer method for an LED chip provided in implementations of the disclosure, with the micro component structure with special stacked adhesive layer structures, when the LED chip 20 is transferred from the micro component structure to the transfer substrate 40, the photolysis adhesive layer 31' connected with the chip can be peptized by a laser with lower energy, and the pyrolysis adhesive layer 32' also can prevent laser irradiation on the LED chip 20, thereby greatly reducing a damage of the laser to the chip in a transfer process of the LED chip 20 through the laser, and significantly improving a transfer yield of the chip. In addition, when the LED chip 20 on the transfer substrate 40 is then transferred onto the display backplane 50, the pyrolysis adhesive layer 32' further can better fill a gap between the extraction electrodes of the chip and the pad group on the display backplane after the pyrolysis adhesive layer 32' is hot melted and then cooled down, further improving the bonding force between the LED chip 20 and the display backplane 50. Therefore, the transfer method for an LED chip provided in implementations of the disclosure is simple and easy to operate, the transfer yield of the LED chip is high, and the bonding force between the LED chip and the display backplane is strong.

Based on the transfer method for an LED chip provided in any of the foregoing implementations, referring to FIG. 18, a display apparatus is further provided in implementations of the disclosure. Specifically, the display apparatus includes a display backplane 50 and multiple LED chips 20, where the LED chips 20 are transferred onto the display backplane 50 with the transfer method provided in any of the foregoing implementations. The display apparatus may be an LED display plane, or devices using the LED display plane, such as a television, a computer, an industrial computer, or the like.

It is to be understood that the disclosure is not to be limited to the disclosed implementations. Those of ordinary skill in the art can make improvements or changes based on the above description, and all these improvements and changes should fall within the protection scope of the appended claims of this disclosure.

What is claimed is:

1. A micro component structure, comprising:
   a substrate having a first surface;
   a plurality of stacked adhesive layer structures spaced on the first surface; and
   a plurality of light-emitting diode (LED) chips correspondingly disposed on the plurality of stacked adhesive layer structures, each of the plurality of LED chips having two extraction electrodes at a surface facing toward the plurality of stacked adhesive layer structures, wherein each of the plurality of stacked adhesive layer structures comprises a photolysis adhesive layer and a pyrolysis adhesive layer that are stacked, the photolysis adhesive layer is in contact with the first surface, and the pyrolysis adhesive layer is located between the two extraction electrodes and has a thickness greater than a height of each of the two extraction electrodes.

2. The micro component structure of claim 1, wherein the pyrolysis adhesive layer has a hot melt temperature lower than the photolysis adhesive layer, and a difference between hot melt temperatures of the pyrolysis adhesive layer and the photolysis adhesive layer is greater than 20° C.

3. The micro component structure of claim 1, wherein the thickness of the pyrolysis adhesive layer is greater than a thickness of the photolysis adhesive layer.

4. The micro component structure of claim 3, wherein the thickness of the photolysis adhesive layer is between 2 µm and 3 µm.

5. The micro component structure of claim 3, wherein the thickness of the pyrolysis adhesive layer is between 4 µm and 6 µm.

6. The micro component structure of claim 1, wherein a width of the photolysis adhesive layer is greater than or equal to a width of the pyrolysis adhesive layer.

7. The micro component structure of claim 6, wherein the width of the photolysis adhesive layer is between 4 µm and 9 µm.

8. The micro component structure of claim 6, wherein the width of the pyrolysis adhesive layer is between 2 µm and 6 µm.

* * * * *